US005506528A

United States Patent [19]
Cao et al.

[11] Patent Number: 5,506,528
[45] Date of Patent: Apr. 9, 1996

[54] HIGH SPEED OFF-CHIP CMOS RECEIVER

[75] Inventors: Tai A. Cao; Satyajit Dutta; Byron L. Krauter; Thai Q. Nguyen; Thanh D. Trinh, all of Austin, Tex.

[73] Assignee: International Business Machines Corporation, Armonk, N.Y.

[21] Appl. No.: 331,834

[22] Filed: Oct. 31, 1994

[51] Int. Cl.⁶ .......................... H03K 17/04; H03K 17/62
[52] U.S. Cl. .......................... 327/108; 327/374; 327/404
[58] Field of Search .................................. 327/108, 404, 327/374

[56] References Cited

U.S. PATENT DOCUMENTS

| | | | |
|---|---|---|---|
| 4,949,086 | 8/1990 | Hofmann | 327/404 |
| 5,103,118 | 4/1992 | Peterson | 307/443 |
| 5,111,081 | 5/1992 | Atallah | 307/475 |
| 5,121,013 | 6/1992 | Chuang et al. | 307/572 |
| 5,132,577 | 7/1992 | Ward | 307/570 |
| 5,159,210 | 10/1992 | Eitrheim et al. | 307/480 |
| 5,243,237 | 9/1993 | Khieu | 307/446 |
| 5,289,056 | 2/1994 | Kewon et al. | 307/446 |
| 5,369,316 | 11/1994 | Chen et al. | 327/108 |

OTHER PUBLICATIONS

IBM Technical Disclosure Bulletin, vol. 34, No. 2, Jul. 1991, R. Moitie and J. Rolland, entitled "BiCMOS Selector", pp. 433–435.

*Primary Examiner*—Margaret Rose Wambach
*Attorney, Agent, or Firm*—Whitham, Curtis, Whitham & McGinn; Thomas E. Tyson

[57] ABSTRACT

A CMOS pass gate receiver improves chip-to-chip communication speed for high speed chips. The high speed CMOS pass gate receiver is immune to overshoot or undershoot and can operate in a frequency greater than or equal to 400 Mhz.

8 Claims, 10 Drawing Sheets

HIGH SPEED OFF-CHIP CMOS RECEIVER

BACKGROUND OF THE INVENTION

1. Field of the Invention

The present invention generally relates to chip-to-chip communication and, more particularly, to high speed complementary metal oxide semiconductor (CMOS) pass gate receivers.

2. Description of the Prior Art

When chip-to-chip communication becomes faster and faster, receiver delay becomes a significant portion of the delay budget. There are basically two inverting stages in the receiver. The main function of the inverting stages is to receive the signals, and magnify and send them to internal circuits. However, since chip-to-chip timing is critical in a 400 Mhz system, these two inverting stages produce a significant delay which it is desired to avoid.

Figure 1:
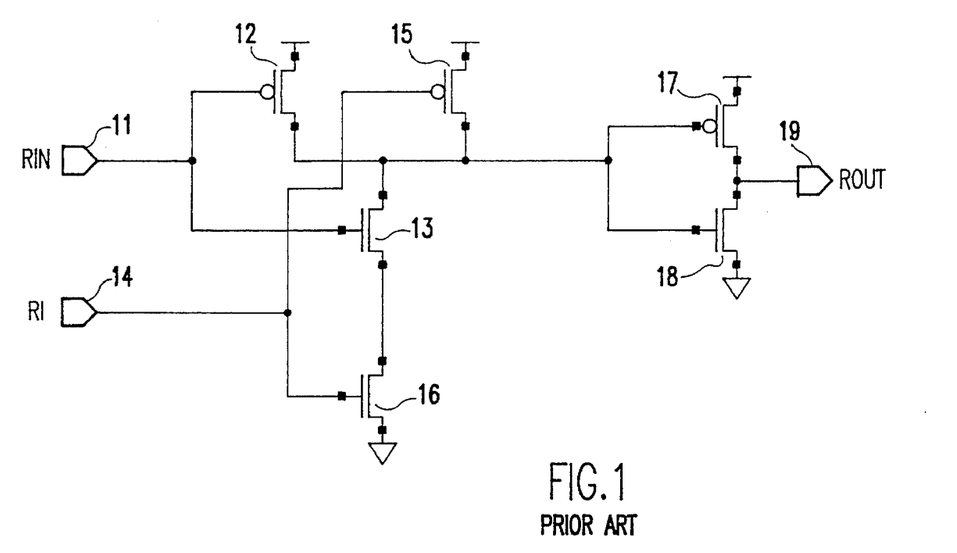
FIG. 1 is a schematic diagram of a conventional NAND-INVERTER receiver.

A typical receiver is a NAND-INVERTER, as shown in FIG. 1. This receiver has two inputs, one for data input and the other for inhibit input. The data input 11 is connected to the gates of complementary metal oxide semiconductor (CMOS) field effect transistors (FETs) 12 and 13. Similarly, the inhibit input 14 connected to the gates of FETs 15 and 16. The FETs 12 and 15 are connected in parallel, while the FETs 13 and 16 are connected in series, forming a NAND gate of conventional design. The output of the NAND gate is connected to the gates of CMOS FETs 17 and 18 connected as a conventional inverter, the output 19 of which is the output of the receiver.

The operation of the receiver is defined by the following truth table:

| RI | IN | ROUT | |
|---|---|---|---|
| 1 | 0 | 0 | ⇒ functional mode |
| 1 | 1 | 1 | ⇒ functional mode |
| 0 | 0 | 0 | ⇒ test mode |
| 0 | 1 | 0 | ⇒ test mode |

As can be seen from the truth table, in functional mode, when the signal RI is a logic "1" it allows the receiver to freely pass a logic "1" or a logic "0". In the test mode, the signal assumes the logic "0" state, forcing the output of the receiver to be a logic "0" for all inputs.

There are two stages of delay; the inverting NAND stage and the inverting inverter stage. In other words, with this receiver design, data has to go through two inverting stages before reaching the internal latch.

SUMMARY OF THE INVENTION

It is therefore an object of the present invention to provide a CMOS pass gate receiver which improves chip-to-chip communication speed.

According to the invention, there is provided a high speed CMOS pass gate receiver which is immune to overshoot or undershoot and can operate in a frequency greater than or equal to 400 Mhz. The pass gate receiver comprises a first n-channel FET having its source connected to an input terminal and its drain connected to an output terminal and a p-channel FET having its source connected to the input terminal and its drain connected to the output terminal. A second n-channel FET has its source connected to a node at the junction of drain of the p-channel FET and the output terminal and its drain connected to circuit ground. An enabling logic level supplies a bias level to the first n-channel FET to turn it on, and an inverter supplies an inverted logic level to the gates of the p-channel FET and the second n-channel FET biasing the p-channel FET on and the second n-channel FET off in a normal mode of operation. In a test mode, the logic level is inverted, biasing the first n-channel FET and the p-channel FET off and the second n-channel FET on to maintain a logic "0" on the output terminal.

The basic design of the pass gate receiver makes it immune to undershoot; that is, an undershoot voltage signal will tend to turn the first n-channel FET on, but the effect is a logic "0" output which is what is required in the test mode. Overshoot is the more serious problem since an overshoot voltage signal will tend to turn on the p-channel FET. The preferred embodiments of the pass gate receiver according to the invention are protected against overshoot. In a first overshoot protected circuit, a resistor is connected in series between the input and the source of the p-channel FET and a third n-channel FET is connected between the node of the resistor and the source of the p-channel FET and circuit ground. This third n-channel FET has its gate connected to the output of the inverter that supplies logic levels to the gates of the p-channel FET and the second n-channel FET. In a second overshoot protected circuit, a plurality of p-channel FETs are connected in series. These plural p-channel FETs are constructed in separate N-wells. The diode voltage drop of each of the p-channel FETs and the maximum overshoot voltage determine the number of p-channel devices in series.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

Figure 2:
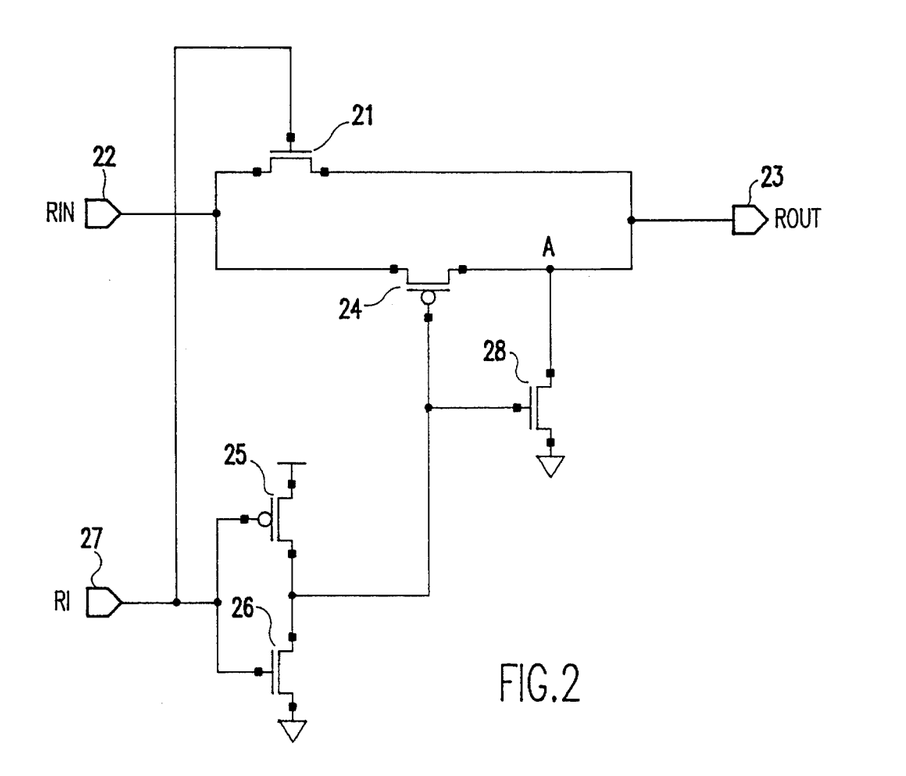
FIG. 2 is the basic pass gate receiver according to the invention without overshoot protection.

Referring again to the drawings, and more particularly to FIG. 2, there is shown a pass gate receiver constructed according to the teachings of the invention. This receiver by-passes the dual inverter stage of conventional receivers to save some delay. The receiver comprises a first n-channel FET 21 having its source connected to data input terminal 22, its drain connected to an output terminal 23 and its gate connected to the inhibit terminal. A p-channel FET 24 has its drain connected to output terminal 23 and its source connected to data input terminal 22. The gate of FET 24 is connected to receive the inverse of the inhibit or test signal RI, or $\overline{RI}$; that is, an inverter comprising complementary FETs 25 and 26 receives the signal RI at terminal 27 and supplies the signal $\overline{RI}$ to the gate of FET 24. A second n-channel FET 28 is connected with its drain connected to node A, at the junction of the drain of FET 24 and output 23, and its source connected to circuit ground. The gate of FET 28 is also connected to receive the signal $\overline{RI}$. In addition, the RI signal input at terminal 27 is supplied to the gate of n-channel FET 21.

The truth table for the pass gate circuit shown in FIG. 2 is as follows:

| RI | IN | ROUT | |
|----|----|----|----|
| 1 | 0 | 0 | ⇒ functional mode |
| 1 | 1 | 1 | ⇒ functional mode |
| 0 | 0 | 0 | ⇒ test mode |
| 0 | 1 | 0 | ⇒ test mode |

This is the same truth table as that for the circuit shown in FIG. 1, as required. When signal RI is a logic "1", both of the n-channel FET 21 and the p-channel FET 24 are biased on, freely passing either a logic "1" or a logic "0" input. However, in the test mode, these FETs are biased off, and the n-channel FET 28 is biased on forcing the output to a logic "0".

Pass gates are fast but they have one main drawback. When turned off, an n-channel device can be turned on by undershoot coming in. Similarly, when turned off, a p-channel device can be turned on by overshoot coming in. Undershoot is not a logic concern here. Undershoot can turn on n-channel FET 21 in inhibit mode, and goes to the input of the latch. A logic "0" is required to be maintained at receiver output, and it has the same logic of an undershoot. The main concern is with overshoot. An overshoot voltage that has a magnitude about $(V_{dd}+V_{tp})$ can turn on FET 24 during inhibit mode, $V_{tp}$ is the threshold of the p-channel FET 24.

Figure 3:
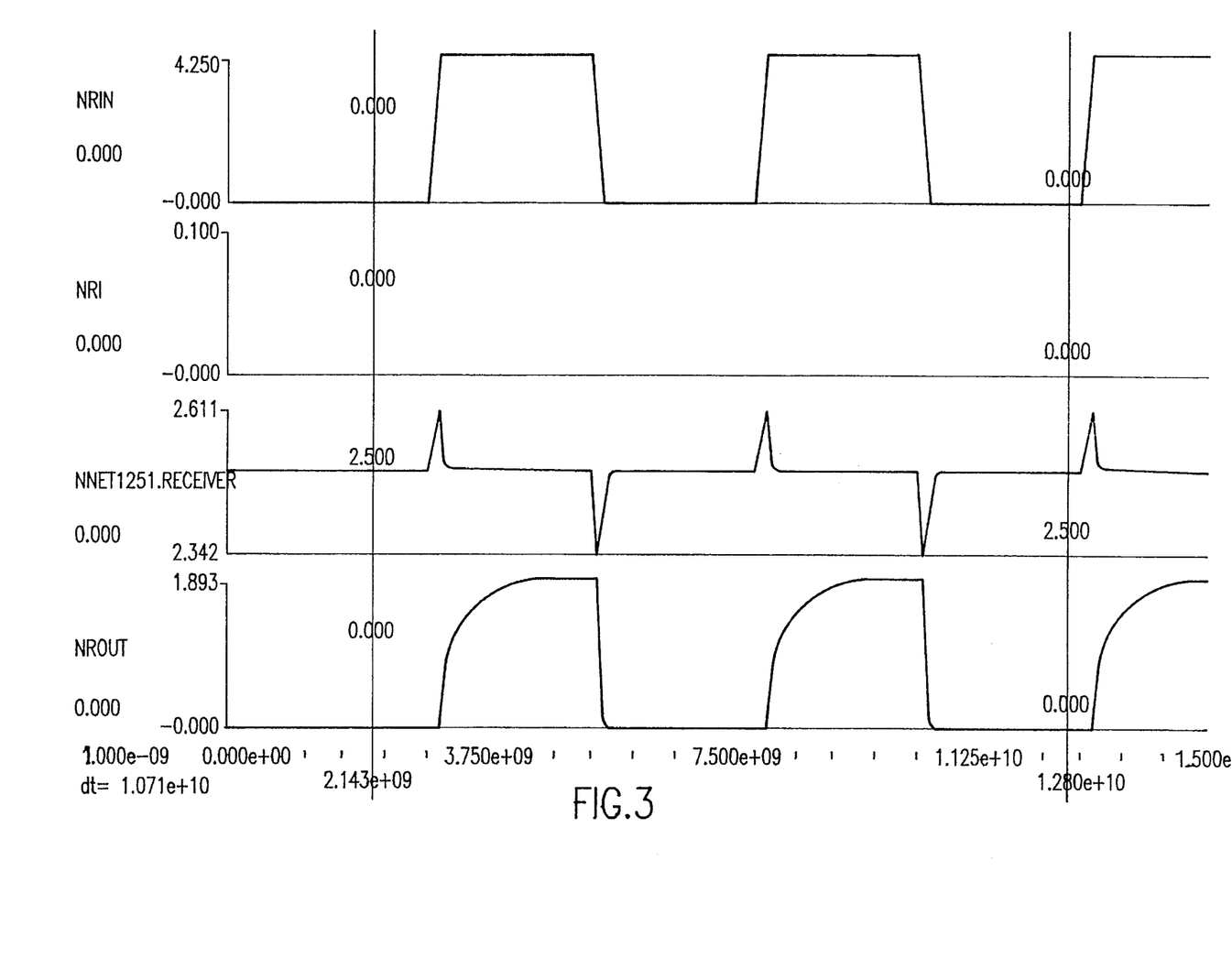
FIG. 3 is a timing diagram showing the operation of the basic pass gate receiver shown in FIG. 2 and the effect of overshoot.

The pass gate receiver shown in FIG. 2 does not have overshoot protection. It basically comprises the n-channel FET 21 and the p-channel FET 24 in parallel and the pull-down n-channel FET 28. This receiver, however, is very susceptible to overshoot because an overshoot can turn on the p-channel FET 24 and corrupts the logic "0" maintained by FET 28 at output 23. FIG. 3 shows a 4.25 V input signal to the receiver. The overshoot is 1.75 V in a 2.5 V system. The result is the output of the receiver is at 1.9 V, which is unacceptable for logic "0" in a 2.5 V system.

Figure 4:
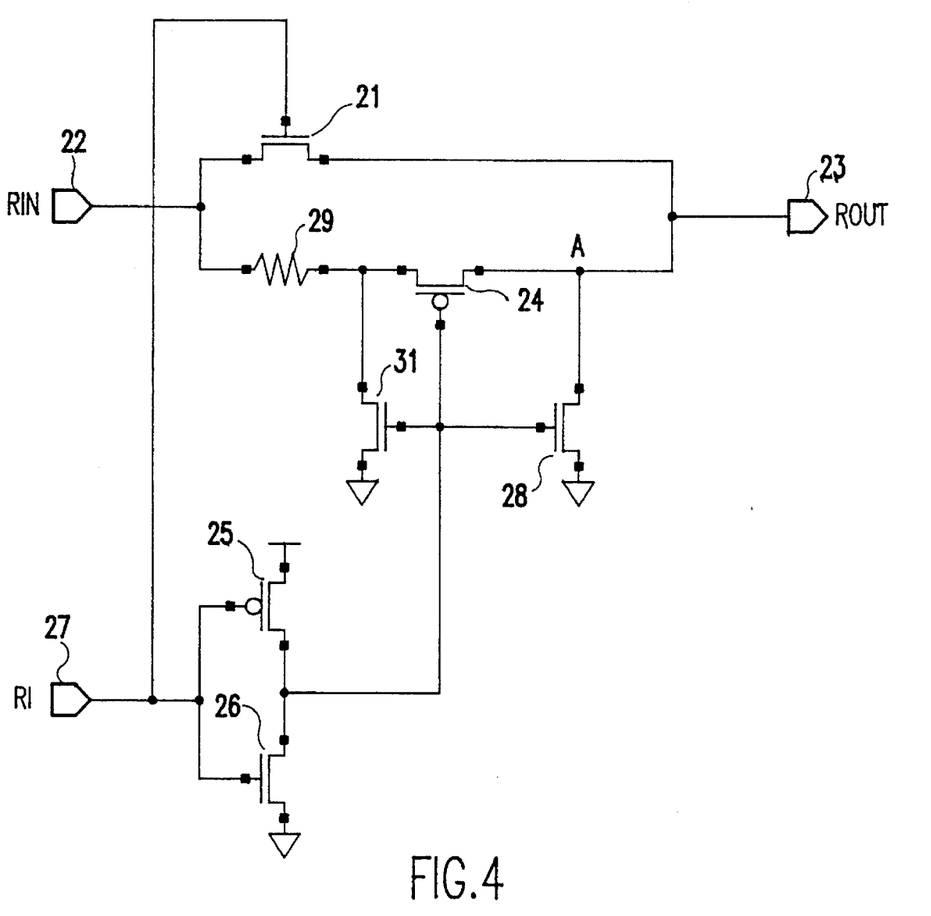
FIG. 4 is a schematic diagram of the pass gate receiver with overshoot protection according to a first preferred embodiment of the invention.

FIG. 4 shows overshoot protection added to the basic circuit of FIG. 2. Specifically, there is added a resistor 29 has in series between the input 22 and the source of p-channel FET 24 and a third n-channel FET 31 having its drain connected to node B, at the junction of the source of FET 24 and resistor 29, and its source connected to circuit ground. The gate of FET 31 is also connected to receive the signal $\overline{RI}$. The resistor 29 and the FET 31 nullify any effect of overshoot in the p-channel FET 24.

To prevent the overshoot voltage at node B, the source of p-channel FET 24, from reaching $(V_{dd}+V_{tp})$, a voltage divider comprising of resistor 29 and n-channel FET 31 are added. The maximum overshoot voltage that can be protected has to be decided such that the value of resistor 29 and the size of FET 31 can be calculated. The voltage at node B, $V_B$, is given by:

$$V_B = V_{IN} \times R_{31}/(R_{29}+R_{31}),$$

where $R_{29}$ is the resistance of resistor 29 and $R_{31}$ is the equivalent resistance of FET 31 when turned on.

Nevertheless, the values of $R_{29}$ and $R_{31}$ depend on the manufacturing process (nominal random number). Resistor 29 is made using a buried resistance (BR) mask, which has tolerance of 10%. A BR is an on-chip layer used to create on-chip resistance. The BR process provides an N+ diffusion resistor. The advantage of the BR resistor is that its value does not vary much with respect to $V_{DD}$ and temperature. The equivalent resistance value of FET 31 depends basically on its channel length. In order for $R_{31}$ of FET 31 to have tolerance of 10%, its effective channel length should be three or four times longer than minimum effective channel length. Therefore, the voltage at node B, $V_B$ is very stable with the process.

Figure 5:
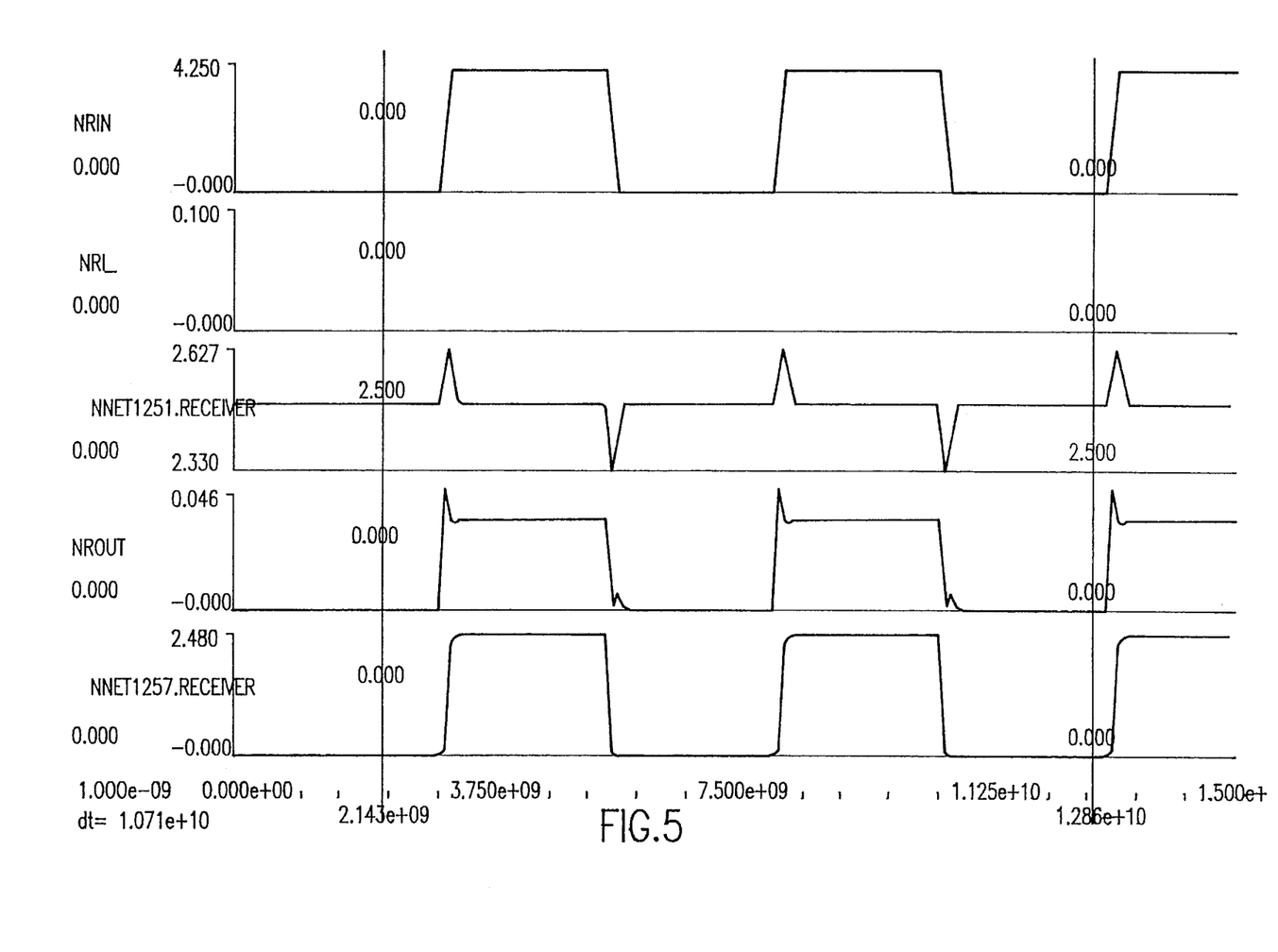
FIG. 5 is a timing diagram showing the operation of the pass gate receiver shown in FIG. 4.

Even with an overshoot voltage of 4.25 V, the output of the receiver is still maintained at 0.05 V or less, as shown in FIG. 5. This is acceptable for logic "0" in a 2.5 V system. Also, as shown in FIG. 5, the voltage at the output of the protection circuit is at 2.5 V which is a reduction from the 4.25 V input. This 2.5 V is not strong enough to turn on the turned-off p-channel FET 24, the gate of which is at 2.5 V.

This high speed off-chip pass gate receiver can stand overshoot logically and acts as a normal pass gate receiver in functional mode, passing both logic "1" and logic "0" with equal ease. However, in test mode it can block overshoot up to a certain voltage and maintains a logic "0" during inhibit. Undershoot has no logical effect on the receiver because it is required to maintain logic "0". In test mode, FETs 21 and 24 are off, blocking all signals coming from the transmission line connected to input terminal 22 to a latch (not shown) connected to the output terminal 23. FET 28 is also on, pulling the receiver output to circuit ground or logic "0", as required.

Figure 6:
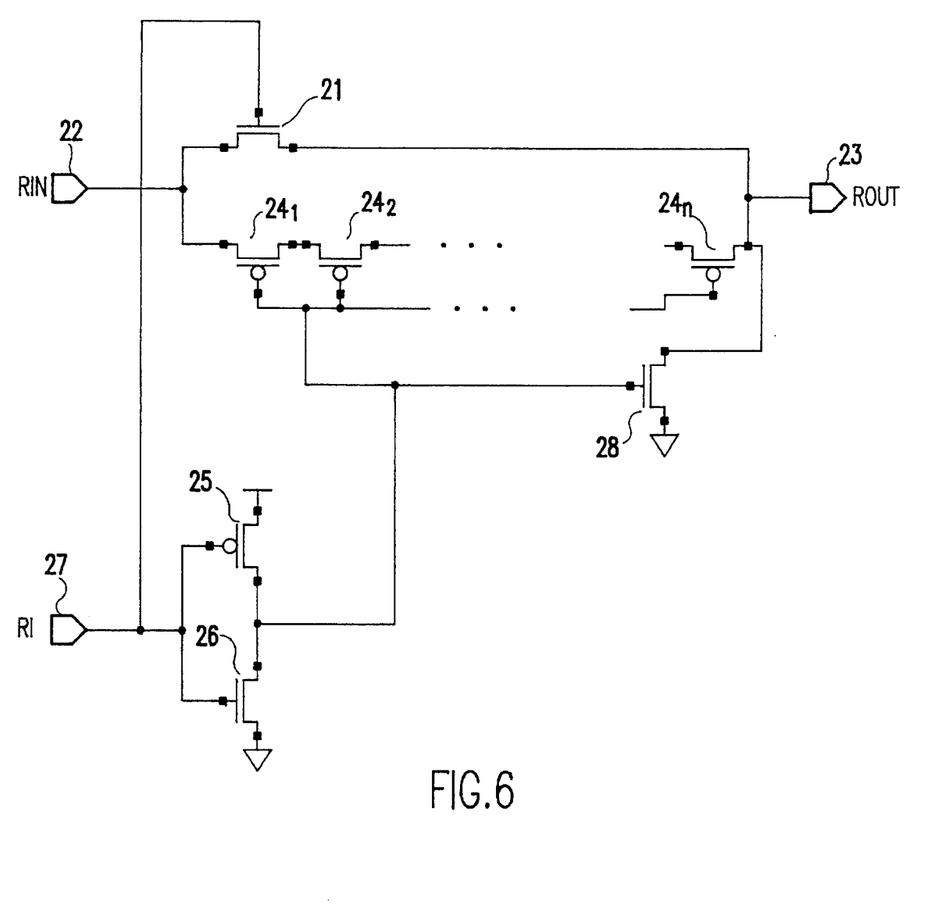
FIG. 6 is a schematic diagram of the pass gate receiver with overshoot protection according to a second preferred embodiment of the invention.

Turning now to FIG. 6, there is shown an alternative embodiment of the invention, wherein like reference numerals designate the same or similar components. In this embodiment, the resistor 29 and the n-channel FET 31 are eliminated and the p-channel FET 24 is replaced by a series of p-channel devices $24_1$ to $24_n$. As in the first embodiment, the pass gate receiver of FIG. 6 passes both logic "1" and logic "0" with minimal delay. However, in test mode, overshoot is blocked up to a predetermined voltage and a logic "0" is maintained at output terminal 23. Undershoot again has no logical effect on the receiver because it is required to maintain logic "0".

In functional mode, n-channel FET 28 is off. On the other hand, n-channel FET 21 and the p-channel devices $24_1$ to $24_n$ are all on. The signals coming from the transmission line connected to terminal 22 just pass through the pass gates and go directly to the latch connected to the output terminal 23. With both n-channel and p-channel devices on, logic "0" and logic "1" pass through the receiver with equal ease. The p-channel devices are connected in series for the purpose of blocking overshoot, as explained below.

Figures 7, 7A:
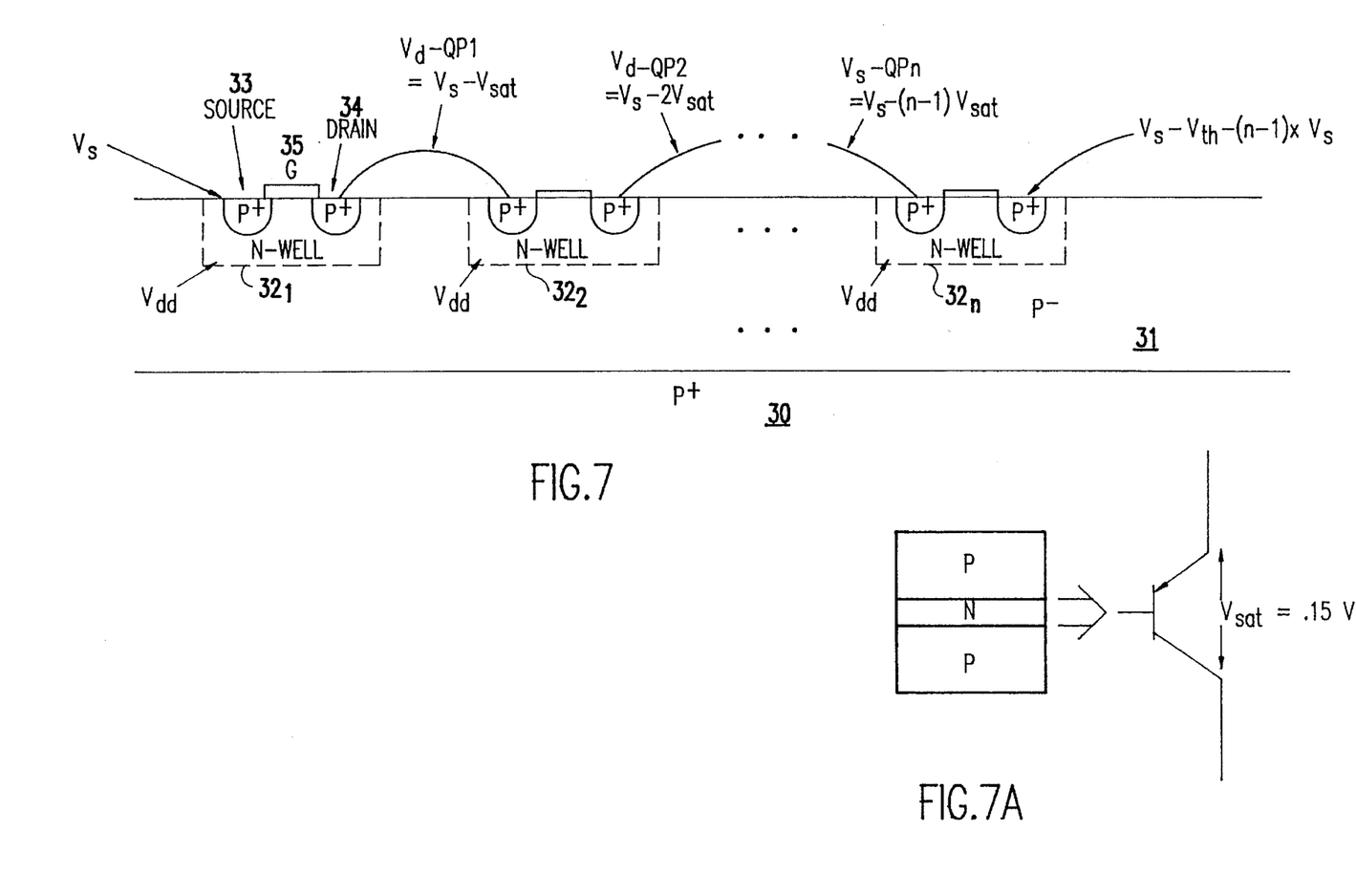
FIG. 7 is a cross-sectional view showing one construction of the p-channel devices in the FIG. 6 embodiment.
FIG. 7A is the equivalent bipolar device for on the p-channel devices shown in FIG. 7 in saturation mode.

In test mode, n-channel FET 21 and p-channel FETs $24_1$ to $24_n$ are off, blocking all signals coming from the transmission line to the latch. n-channel FET 28 is on, pulling the output of the receiver to logic "0", as required for testability. To obtain a voltage drop that will nullify an overshoot, holes have to be forced to travel a route that has many drops. To achieve this, each p-channel device in series has its own N-well as is shown in FIG. 7. In FIG. 7, the P+ substrate 30 has formed thereon an epitaxially grown P– layer 31 into which a plurality of N wells $32_1$ to $32_n$ are formed by appropriate doping. Within each of the N wells, a P+ source 33 and a P+ drain 34 are formed, with an oxide and metal gate structure 35 therebetween. With separated N-well holes, holes due to overshoot are forced to travel the following route:

Source FET $24_1 \rightarrow$ Drain FET $24_1 \rightarrow$ Source FET $24_2 \rightarrow$ Drain FET $24_2 \rightarrow \ldots \rightarrow$ Source FET $24_n \rightarrow$ Drain FET $24_n$ When traveling through one p-channel device, overshoot voltage $V_s$ drops an equivalent diode drop. As a result, the voltage at the drain of FET $24_n$ is given by $V_{dn} = V_s - Vth_{P-device} - (N-1) \times V_{saturation}$, where $V_s$ is overshoot voltage, $Vth_{Pdevice}$ is the threshold of the P device, $V_{saturation}$ is the saturation voltage of a PNP parasitic bipolar device, as shown in FIG. 7A, and N is the number of p-channel devices. The last P device FET $24_n$ is fully off and provides a full threshold voltage drop, which is about 0.7 V. The diode drop voltage and the maximum overshoot voltage that can be protected determine the number of p-channel devices in series.

Figure 8:
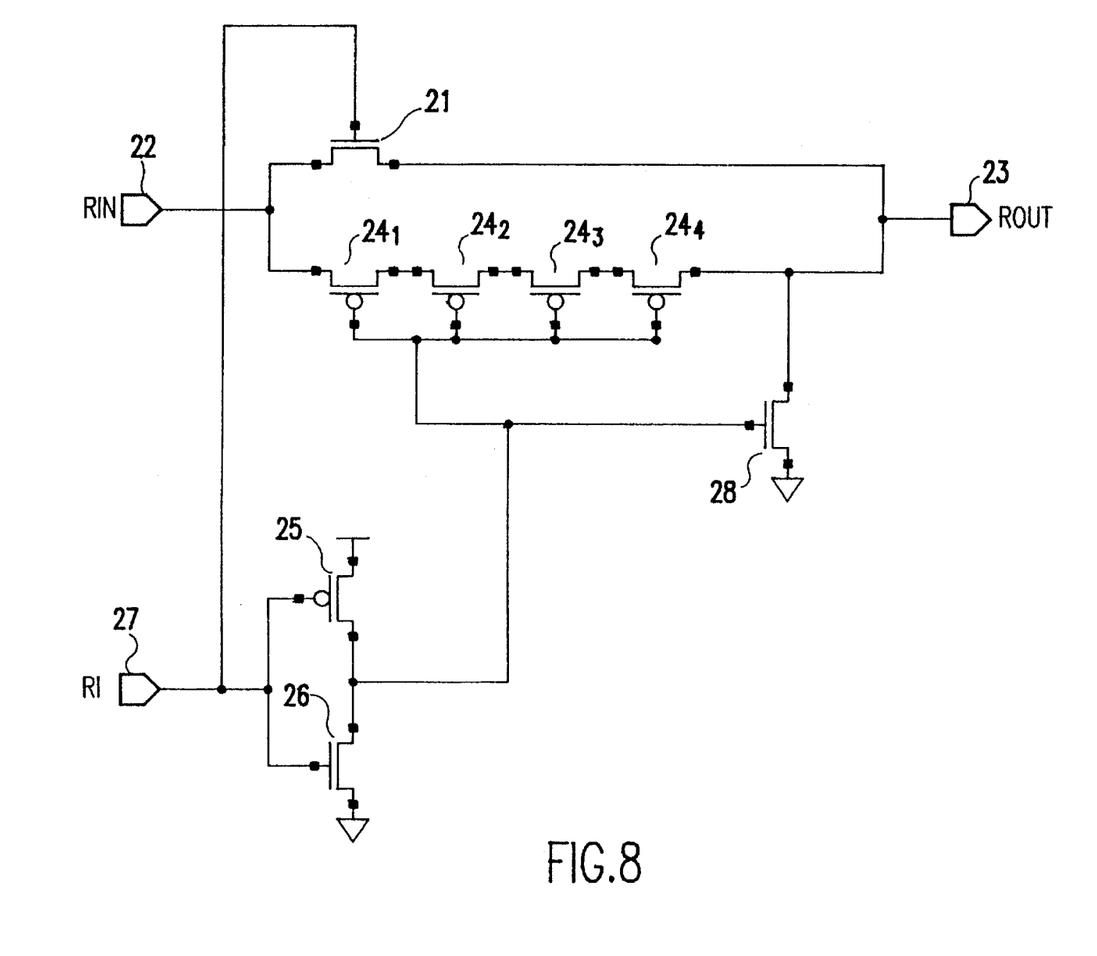
FIG. 8 is a schematic diagram showing the circuit of the FIG. 6 embodiment comprising four p-channel FETs in separate N-wells.
Figure 9:
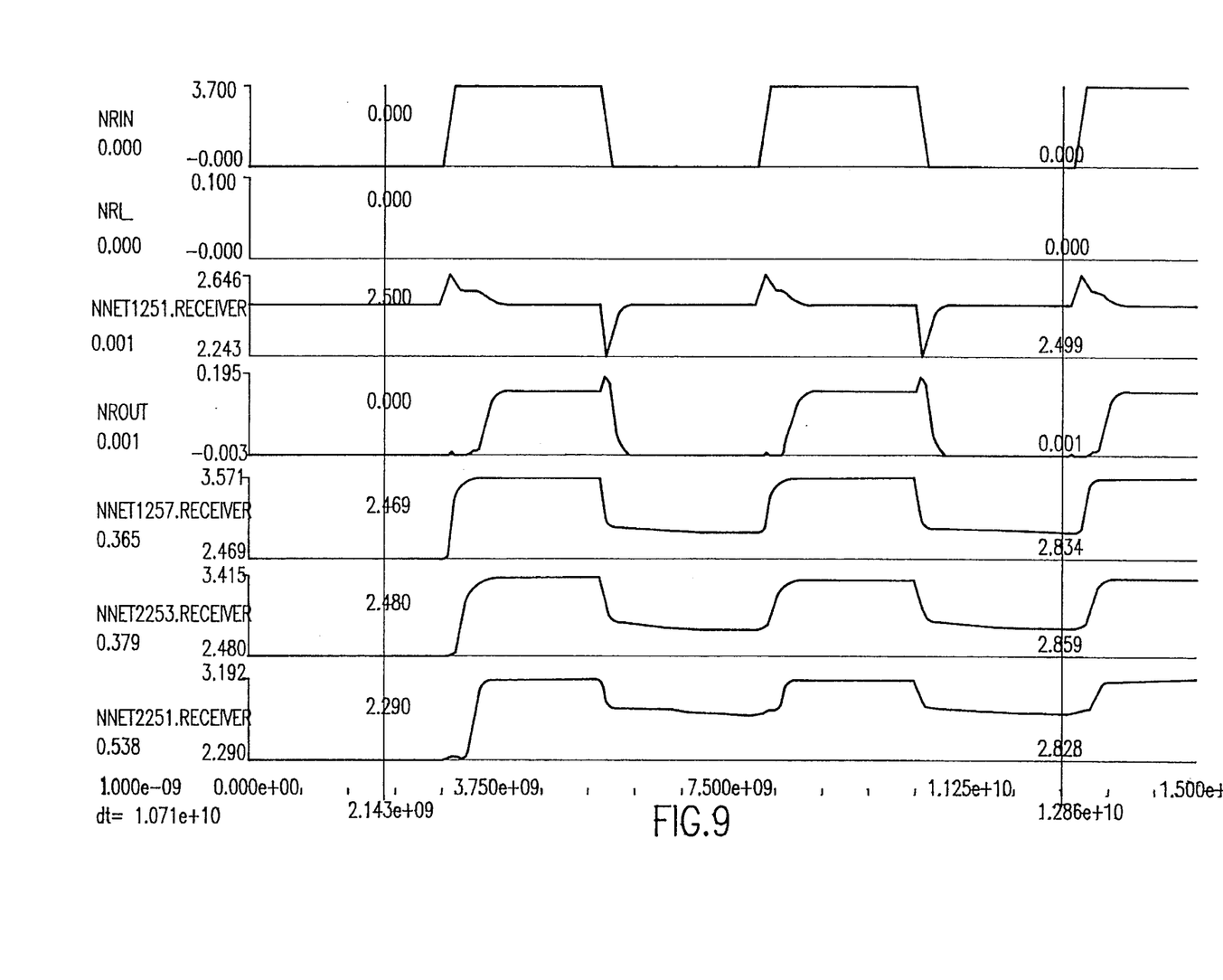
FIG. 9 is a timing diagram showing the operation of the pass gate receiver shown in FIG. 8.
Figure 10:
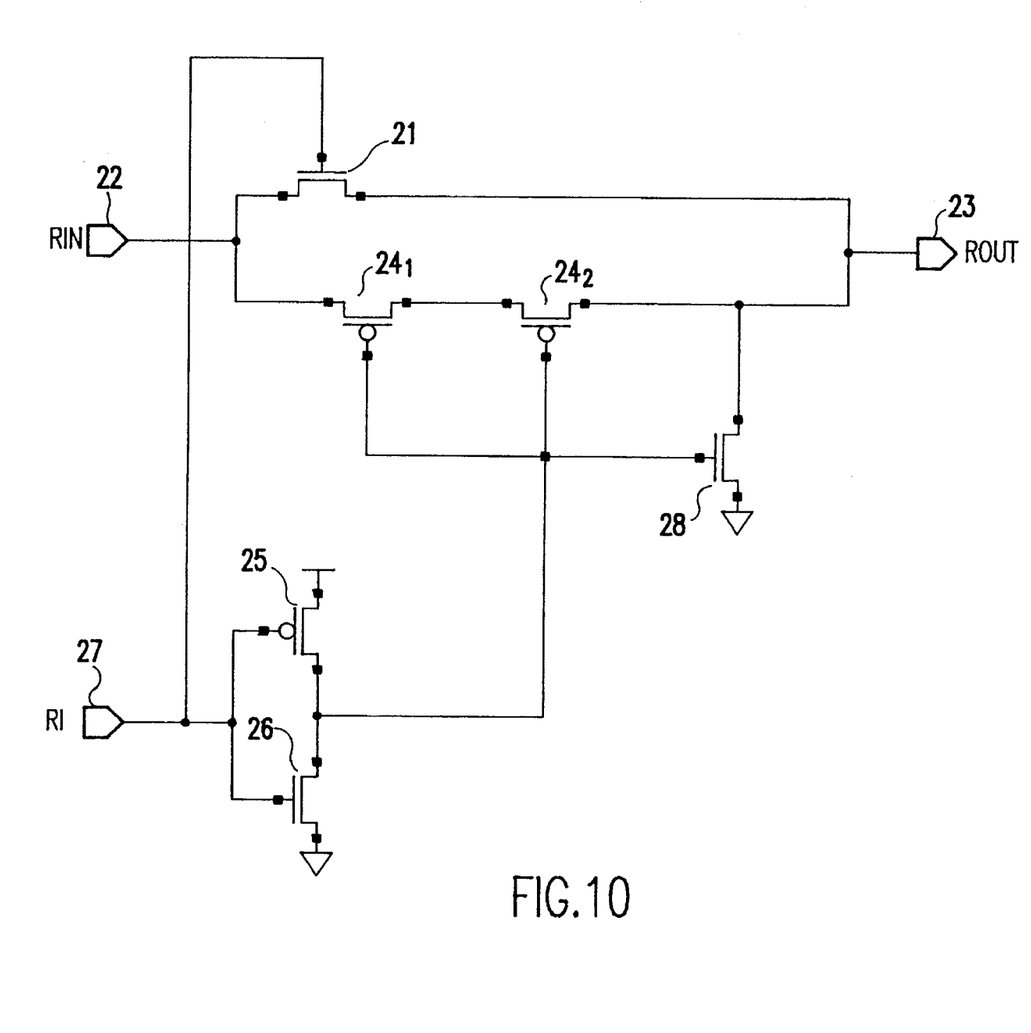
FIG. 10 is a schematic diagram showing the circuit of the FIG. 6 embodiment comprising two p-channel FETs in separate N-wells.
Figure 11:
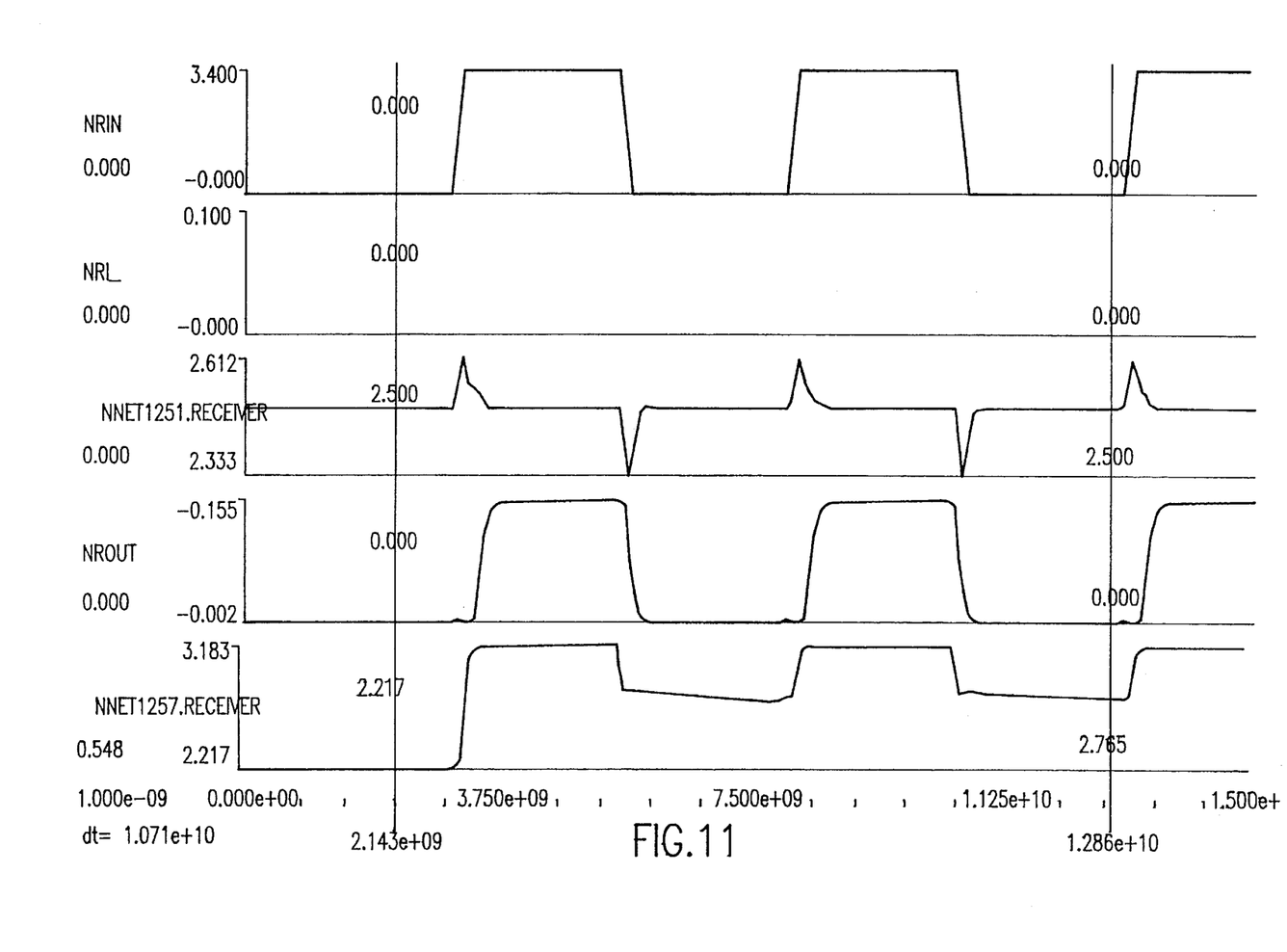
FIG. 11 is a timing diagram showing the operation of the pass gate receiver shown in FIG. 10.

FIG. 8 shows a specific example of the alternative embodiment where N=4. FIG. 9 shows the measured overshoot protection provided by the circuit of FIG. 8. FIG. 10 shows a specific example of the alternative embodiment where N=2, and FIG. 11 shows the measured overshoot protection provided by this circuit.

While the invention has been described in terms of two preferred embodiments and alternate constructions, those skilled in the art will recognize that the invention can be practiced with modification within the spirit and scope of the appended claims.

Having thus described our invention, what we claim as new and desire to secure by Letters Patent is as follows:

1. A pass gate receiver for chip-to-chip communications comprising:

a first n-channel FET having its source connected to an input terminal and its drain connected to an output terminal of the pass gate receiver;

a p-channel FET having its source connected to the input terminal and its drain connected to the output terminal;

a second n-channel FET having its source connected to a first node between the drain of said p-channel FET and the output terminal, said second n-channel FET serving as a pull-down device when said second n-channel FET is biased on; and means biasing the first n-channel FET and the p-channel FET on and the second n-channel FET off in a normal mode of operation and biasing the first n-channel FET and the p-channel FET off and the second n-channel FET on in a test mode to maintain a logic "0" on said output terminal during the test mode.

2. A pass gate receiver for chip-to-chip communications comprising:

a first n-channel FET having its source connected to an input terminal and its drain connected to an output terminal;

a p-channel FET having its source connected to the input terminal and its drain connected to the output terminal;

a second n-channel FET having, its source connected to a first node between the drain of said p-channel FET and the output terminal, said second n-channel FET serving as a pull-down device when said second n-channel FET is biased on;

means biasing the first n-channel FET and the p-channel FET on and the second n-channel FET off in a normal mode of operation and biasing the first n-channel FET and the p-channel FET off and the second n-channel FET on in a test mode to maintain a logic "0" on said output terminal during the test mode; and means for protecting said p-channel FET from an input overshoot voltage so as not to corrupt a logic "0" maintained on said output terminal during the test mode.

3. A pass gate receiver as recited in claim 2, wherein said means for protecting said p-channel FET from an input overshoot voltage comprises:

a resister connected between said input terminal and the source of said p-channel FET, the connection between said resistor and the source of said p-channel FET being a second node; and a third n-channel FET having its source connected to said second node and its drain connected to circuit ground, said third n-channel FET being biased on and off with said second n-channel FET, and said resistor and said third n-channel FET forming a voltage divider when said third n-channel FET is on.

4. A pass gate receiver as recited in claim 3, wherein the channel length of the third n-channel FET is chosen such that the voltage divider ratio of the resistance of said third n-channel FET when on to the sum of the resistance of the resistor and the resistance of the third n-channel FET remains relatively constant thereby providing overshoot protection during the test mode.

5. A pass gate receiver as recited in claim 2, wherein said means for protecting said p-channel FET from an input overshoot voltage comprises at least a second p-channel FET connected in series between the input terminal and the first p-channel FET.

6. A pass gate receiver as recited in claim 5, wherein said first and second p-channel FETs are formed in separate N-wells in an epitaxially grown P– layer on a P+ silicon substrate, the overshoot voltage protection being a function of diode voltage drops across each of said first and second p-channel FETs.

7. A pass gate receiver as recited in claim 5, wherein a plurality of p-channel FETs are connected in series as said first and second p-channel FETs, the number of p-channel FETs determining the overshoot voltage protection afforded.

8. A pass gate receiver as recited in claim 7, wherein said plurality of p-channel FETS are formed in separate N-wells in an epitaxially grown P– layer on a P+ silicon substrate, the overshoot voltage protection being a function of diode voltage drops across each of said plurality of p-channel FETs.

* * * * *